(12) United States Patent
Yang et al.

(10) Patent No.: US 10,896,877 B1
(45) Date of Patent: Jan. 19, 2021

(54) SYSTEM IN PACKAGE WITH DOUBLE SIDE MOUNTED BOARD

(71) Applicant: Flex Ltd., Singapore (SG)

(72) Inventors: Cheng Yang, Shanghai (CN); Dongkai Shangguan, San Jose, CA (US); Bo Li, JiangSu (CN); Venkat Iyer, Cupertino, CA (US)

(73) Assignee: Flex Ltd., Singapore (SG)

(*) Notice: Subject to any disclaimer, the term of this patent is extended or adjusted under 35 U.S.C. 154(b) by 0 days.

(21) Appl. No.: 16/221,256

(22) Filed: Dec. 14, 2018

(51) Int. Cl.
| | |
|---|---|
| *H01L 23/538* | (2006.01) |
| *H01L 23/00* | (2006.01) |
| *H01L 21/56* | (2006.01) |
| *H01L 23/498* | (2006.01) |
| *H01L 23/522* | (2006.01) |
| *H01L 23/532* | (2006.01) |
| *H01L 23/31* | (2006.01) |

(52) U.S. Cl.
CPC ........ *H01L 23/5386* (2013.01); *H01L 21/563* (2013.01); *H01L 21/565* (2013.01); *H01L 23/3128* (2013.01); *H01L 23/49816* (2013.01); *H01L 23/49833* (2013.01); *H01L 23/5226* (2013.01); *H01L 23/5385* (2013.01); *H01L 23/53228* (2013.01); *H01L 24/17* (2013.01); *H01L 24/49* (2013.01)

(58) Field of Classification Search
CPC ..... H01L 23/5386; H01L 24/17; H01L 24/49; H01L 21/565; H01L 21/563; H01L 23/49816; H01L 23/5226; H01L 23/53228; H01L 23/49833; H01L 23/5385; H01L 23/3128; H01L 23/538; H01L 23/00; H01L 21/56; H01L 23/498; H01L 23/522; H01L 23/532; H01L 23/31

USPC ................ 257/723, 777, 778, 738, 686, 737
See application file for complete search history.

(56) References Cited

U.S. PATENT DOCUMENTS

| | | | |
|---|---|---|---|
| 4,855,537 A | 8/1989 | Nakai et al. | |
| 5,479,138 A | 12/1995 | Kuroda et al. | |
| 5,675,299 A | 10/1997 | Suski | |
| 6,518,677 B1 | 2/2003 | Capote | |
| 7,504,904 B1 | 3/2009 | Powers et al. | |
| 7,687,899 B1 * | 3/2010 | Berry | H01L 21/561 |
| | | | 257/687 |
| 7,872,343 B1 * | 1/2011 | Berry | H01L 21/561 |
| | | | 257/687 |
| 8,034,447 B2 | 10/2011 | Sakai | |
| 8,283,767 B1 * | 10/2012 | Berry | H01L 21/561 |
| | | | 257/686 |

(Continued)

FOREIGN PATENT DOCUMENTS

KR    20090090701 A  *  7/2009

OTHER PUBLICATIONS

Non-Final Office Action, U.S. Appl. No. 16/196,395, filed Nov. 20, 2018, applicant: Yoav Alfandri, Examiner: Prasad; Neil R., art unit: 2897, dated Oct. 4, 2019, 13 pages.

*Primary Examiner* — Alexander O Williams
(74) *Attorney, Agent, or Firm* — Haverstock & Owens LLP

(57) ABSTRACT

An improved SiP structure includes one or more interposers positioned to form a center cavity into which one or more electronic components can be mounted. The improved SiP structure provides a reduced footprint using the one or more interposers and formed center cavity without the need of laser drilling, exposed molding, and/or double side molding.

11 Claims, 8 Drawing Sheets

(56) References Cited

U.S. PATENT DOCUMENTS

| | | | |
|---|---|---|---|
| 8,409,917 B2* | 4/2013 | Yoon | H01L 21/563 |
| | | | 438/106 |
| 8,450,848 B2 | 5/2013 | Sakurai | |
| 8,497,579 B1 | 7/2013 | Shih | |
| 8,587,385 B2 | 11/2013 | Umeda | |
| 8,728,865 B2 | 3/2014 | Haba | |
| 8,928,865 B2 | 1/2015 | Rakuljic | |
| 8,941,225 B2* | 1/2015 | Choi | H01L 25/50 |
| | | | 257/686 |
| 8,970,051 B2 | 3/2015 | Shi | |
| 10,121,722 B1* | 11/2018 | Jha | H01L 24/32 |
| 10,186,480 B2* | 1/2019 | Muthukumar | H01L 23/3121 |
| 2002/0056906 A1 | 5/2002 | Kajiwara | |
| 2004/0224441 A1 | 11/2004 | Saito | |
| 2005/0039945 A1 | 2/2005 | Matsuda | |
| 2009/0029504 A1 | 1/2009 | Paik | |
| 2009/0140415 A1* | 6/2009 | Furuta | H01L 25/105 |
| | | | 257/700 |
| 2009/0166835 A1* | 7/2009 | Yang | H01L 25/105 |
| | | | 257/686 |
| 2009/0243072 A1* | 10/2009 | Ha | H01L 25/0657 |
| | | | 257/686 |
| 2010/0148356 A1* | 6/2010 | Tamaki | H01L 25/0657 |
| | | | 257/712 |
| 2011/0031598 A1* | 2/2011 | Lee | H01L 24/73 |
| | | | 257/686 |
| 2013/0069239 A1* | 3/2013 | Kim | H01L 23/49827 |
| | | | 257/774 |
| 2013/0214396 A1* | 8/2013 | Kim | H01L 23/552 |
| | | | 257/659 |
| 2014/0312481 A1* | 10/2014 | Choi | H01L 25/50 |
| | | | 257/686 |
| 2015/0001731 A1* | 1/2015 | Shuto | H01L 24/19 |
| | | | 257/774 |
| 2015/0084170 A1* | 3/2015 | Im | H01L 23/49833 |
| | | | 257/675 |
| 2015/0287672 A1* | 10/2015 | Yazdani | H01L 23/49838 |
| | | | 257/414 |
| 2016/0043047 A1* | 2/2016 | Shim, II | H01L 21/56 |
| | | | 257/773 |
| 2016/0329272 A1* | 11/2016 | Geissler | H01L 24/92 |
| 2017/0047308 A1* | 2/2017 | Ho | H01L 23/5386 |
| 2017/0099729 A1 | 4/2017 | Kim et al. | |
| 2017/0141080 A1* | 5/2017 | Chen | H01L 25/0657 |
| 2017/0170799 A1 | 6/2017 | Kong et al. | |
| 2017/0250170 A1* | 8/2017 | Yu | H01L 23/49816 |
| 2018/0090471 A1* | 3/2018 | Chiu | H01L 25/105 |
| 2018/0164921 A1 | 6/2018 | Leigh | |
| 2018/0269181 A1* | 9/2018 | Yang | H01L 21/566 |
| 2018/0277485 A1* | 9/2018 | Han | H01L 23/5389 |
| 2018/0315740 A1* | 11/2018 | Im | H01L 23/3128 |
| 2018/0366412 A1* | 12/2018 | Hsieh | H01L 25/105 |
| 2019/0019758 A1* | 1/2019 | Kim | H01L 23/5386 |
| 2019/0051615 A1* | 2/2019 | Nair | H01L 23/3675 |
| 2019/0067207 A1* | 2/2019 | Hu | H01L 21/561 |
| 2019/0067258 A1* | 2/2019 | Kim | H01L 25/50 |
| 2019/0074267 A1* | 3/2019 | Yang | H01L 25/16 |
| 2019/0103364 A1* | 4/2019 | Kim | H01L 25/0657 |
| 2019/0181097 A1* | 6/2019 | Cheah | H01L 24/20 |
| 2019/0229046 A1* | 7/2019 | Tsai | H01L 24/20 |
| 2019/0295937 A1* | 9/2019 | Zhang | H01L 24/13 |
| 2019/0378795 A1* | 12/2019 | Lee | H01L 23/5385 |
| 2019/0385977 A1* | 12/2019 | Elsherbini | H01L 24/24 |
| 2020/0043299 A1 | 2/2020 | Mabille | |
| 2020/0105719 A1* | 4/2020 | Li | H01L 25/0657 |
| 2020/0108768 A1 | 4/2020 | Ali | |
| 2020/0194330 A1* | 6/2020 | Ramanathan | H01L 24/17 |
| 2020/0294923 A1* | 9/2020 | Bhagavat | H01L 21/4857 |

* cited by examiner

US 10,896,877 B1

SYSTEM IN PACKAGE WITH DOUBLE SIDE MOUNTED BOARD

FIELD OF THE INVENTION

The present invention is generally directed to the field of system in package structures. More specifically, the present invention is directed to a system in package with double side mounted board.

BACKGROUND OF THE INVENTION

A semiconductor package is a metal, plastic, glass, or ceramic casing containing one or more semiconductor electronic components, such as integrated circuit devices, also referred to as chips or die. Individual discrete IC devices are first manufactured before being assembled in a package. The package provides protection against impact and corrosion, holds contact pins or leads which are used to connect from external circuits to the IC device, and dissipates heat produced in the IC device.

A system in package (SiP) is a further level of integration where multiple IC devices are integrated inside a single package. Traditionally, multiple specialized IC devices needed to be assembled and connected on a PCB. In SiP, that level of connectivity is now integrated into the package itself. Several packaging techniques are used to connect multiple dies together using vertical configurations (3D).

FIG. 1 illustrates a cut out side view of a conventional SiP structure. The SiP structure 2 shown in FIG. 1 is a package on package (PoP) with through mold via (TMV) structure. The PoP with TMV structure includes a first package 4 interconnected to a second package 14 via solder ball interconnects 26 with an intervening air gap 28 between the two mounted packages 4, 14. Each solder ball interconnect 26 provide an electrical interconnect between the substrate 10 and TMV 24. Prior to mounting the first package 4 to the second package 14, the first package 4 is made by interconnecting an IC device 6 to a substrate 10 via solder ball interconnects 8. A single sided molding step is performed to form a molding 12 that encapsulates the IC device 6. The second package 14 is made by interconnecting an IC device 16 to a substrate 20 via solder ball interconnects 18. A single sided molding step is performed to form a molding 22 that encapsulates the IC device 16. TMVs 24 are formed through the molding 22. Each TMV 24 can be formed by first forming a through hole through the entire thickness of the molding 22, such as by mechanical or laser drilling, and filling the through hole with an electrically conductive material, such as copper. The electrically conductive material within each TMV 24 is electrically connected to a corresponding electrical connection point on the substrate 20. Each solder ball interconnect 26 provides an electrical interconnection between an electrical connection point on the substrate 10 and a corresponding TMV 24, and each TMV 24 provides an electrical interconnection between the solder ball interconnect 26 and an electrical connection point on the substrate 20. Solder ball interconnects 28 are connected to the substrate 20. The SiP structure 2 can then be externally connected using the solder ball interconnects 28.

A problem with the PoP with TMV structure, such as that shown in FIG. 1, is that there is a need to manufacture two separate packages and then mount them together. Additionally, the PoP structure resulting from mounting together two packages with solder ball interconnects has a thickness that is too large for many applications. Still additionally, forming a TMV through a thick mold layer can be difficult.

FIG. 2 illustrates a cut out side view of another conventional SiP structure. The SiP structure 30 shown in FIG. 2 is a double side molded with TMV or copper column structure. The double side molded with TMV or copper column structure includes a single, double side mounted substrate 38 with a first flip-chip IC device 32 interconnected to a first side 36 of the substrate 38 using solder ball interconnects 34 and a second flip-chip IC device 40 interconnected to a second side 44 of the substrate 38 using solder ball interconnects 42. After the flip-chip IC devices 32, 40 are mounted to the substrate 38, the resulting assembly is double side molded with a molding 46 that encapsulates both flip-chip IC devices 32, 40. The molding 46 refers to both top side and bottom side molding of the substrate 38. TMVs 48 are formed through an entire thickness of the bottom side molding 46 to the second side 44 of the substrate 38. The TMVs 48 can be formed as through holes which are filled with conductive material, such as copper. A solder ball interconnect 50 is connected to each of the TMVs 48. The SiP 30 can then be externally connected using the solder ball interconnects 50. Alternatively to forming TMVs through the molding 46, prior to the double side molding step, copper columns 48 can be mounted to the second side 44 of the substrate 38. The double side molding step is then performed to encapsulate both flip-chip IC devices 32, 40 and the mounted copper columns 48. A grinding step is performed to expose an end of each copper column 48. The solder ball interconnect 50 is connected to the exposed end of each of the copper columns 48.

A problem with the double side molded with TMV or copper column structure, such as that shown in FIG. 2, is that the double side molding process is not a mature technology and is not yet applicable to mass production. Double side molding typically also requires two separate molding steps, a first molding step to apply molding to a top side of the substrate and a second molding step to apply molding to a bottom side of the substrate. Two separate molding steps are typically required because the substrate, such as substrate 38, is part of a single section of a larger, continuous panel. The process steps all can be performed while the substrate remains intact as part of the panel. After the process steps are performed, a singulation step is performed to form the discrete SiP structure, such as the SiP structure 30 shown in FIG. 2. Another problem with the double side molded with TMV or copper column structure is that forming a TMV through a thick mold layer can be difficult. In the case where a copper column is used instead of a TMV, in order to mount the copper column by SMT, only a low profile copper column is acceptable which limits the pitch to height ratio. Additionally, a grinding step needs to be performed after the double side molding step in order to expose an end of each copper column for forming second level interconnection.

FIG. 3 illustrates a cut out side view of another conventional SiP structure. The SiP structure 53 shown in FIG. 3 is a bottom side exposed molding with interposer structure. The bottom side exposed molding with interposer structure is similar to the double side molded with TMV or copper column structure except an interposer 66 replaces each TMV or copper column. Use of interposers 66 also requires the double side molding process include an exposed molding procedure to expose an end 74 of each interposer 66. The bottom side exposed molding with interposer structure includes a single, double side mounted substrate 58 with a first flip-chip IC device 52 interconnected to a first side 56 of the substrate 58 using solder ball interconnects 54 and a second flip-chip IC device 62 interconnected to a second side 60 of the substrate 58 using solder ball interconnects 64.

Each interposer 66 is an interposer PCB. One or more solder balls 68 are connected to each interposer 66, one solder ball 68 is shown in the cross-sectional illustration of FIG. 3. Each interposer 66 is connected to the substrate 58 in a manner similar to the flip chip IC device 62 being connected to the substrate 58, such as by SMT. Each interposer 66 has a height greater than the flip chip IC device 62, and as such extends beyond the flip chip IC device 62 when both are attached to the substrate 58. For example, a bottom side 74 of each interposer 66 extends lower than a bottom side 75 of the flip chip IC device 62. Although only a single flip chip IC device 62 is shown connected to the bottom side surface 60 of the substrate 58, it is understood that more than one electronic component can be connected to the bottom side surface 60, in which case each interposer 66 has a height greater than each of the electronic components connected to the bottom side surface 60. After the flip-chip IC devices 52, 62 and interposers 66 are mounted to the substrate 58, the resulting assembly is double side molded with a molding 70 that encapsulates both flip-chip IC devices 52, 62. The double side molding process includes an exposed molding technique which encapsulates the flip chip IC device 52, 62, but leaves exposed the bottom side 74 of each interposer 66 at a bottom side surface 72 of the molding 70. One or more contact pads (not shown) of each interposer 66 can be exposed on the bottom side 74, and a solder ball 76 is connected to each of the exposed contact pads of the interposer 66. Each solder ball 76 provides an electrical connection point of the SiP structure 53 to be mounted to another electronic device, such as a circuit board.

A problem with the bottom side exposed molding with interposer structure, such as that shown in FIG. 3, is that the exposed molding process which is a part of the double side molding process is not a mature technology and is not yet applicable to mass production. Additionally, the molding process also requires an exposed molding procedure to expose the end 74 of each interposer 66, such as by the use of a protective film over the ends 74 during the molding step. Similar exposed molding procedure can be used for the copper column alternative embodiment described in regard in FIG. 2, when a copper column end surface co-planarity can be well controlled.

FIG. 4 illustrates a cut out side view of another conventional SiP structure. The SiP structure 78 shown in FIG. 4 is a package in package structure. The package in package structure includes a package 80 mounted to a flip chip IC device 90 and electrically interconnected to a substrate 94 using wire bonds 96. The package 80 is first formed. The package 80 is made by interconnecting an IC device 80 to a substrate 86 via solder ball interconnects 84. A single side molding step is performed to form a molding 88 that encapsulates the IC device 82. Separately, the flip chip IC Device 90 is interconnected to the substrate 94 via solder ball interconnects 92. The package 80 is then mechanically attached to the flip chip IC device 90, such as by an adhesive (not shown) between the mold layer 88 and the flip chip IC device 90. Select peripheral electrical connection points on a surface 104 of the substrate 94 are electrically interconnected to select electrical connection points on a surface 98 of the substrate 86 by wire bonds 96. A single side molding step is performed to apply mold layer 100 over the package 80, the flip chip semiconductor 90, the wire bonds 96, and the surface 104 of the substrate 94. Solder ball interconnects 106 are attached to electrical connection points on a surface 102 of the substrate 94. Each solder ball interconnect 106 provides an electrical connection point of the SiP structure 78 to be mounted to another electronic device, such as a circuit board.

FIG. 5 illustrates a cut out side view of another conventional SiP structure. The SiP structure 108 shown in FIG. 5 uses an interposer with wire bonding structure. The interposer with wire bonding structure includes a first assembly 110 mounted to a second assembly 122 and electrically interconnected to each other using wire bonds 134. The first assembly 110 is formed by interconnecting a flip chip IC device 112 to a surface 118 of a substrate 116 using solder ball interconnects 114. The substrate 116 functions as an interposer. The second assembly is separately formed by interconnecting a flip chip IC device 124 to a surface 130 of a substrate 128 using solder ball interconnects 126. The first assembly 110 is then mounted to the second assembly 122 by attaching a surface 120 of the substrate 116 to the flip chip IC device 124, such as by using an adhesive (not shown). Select peripheral electrical connection points on the surface 118 of the substrate 116 are then electrically interconnected to select peripheral electrical connection points on the surface 130 of the substrate 128 by one or more wire bonds 134. A footprint of the substrate 116 is smaller than that of the substrate 128 to enable this wire bonding connection between the two substrates. A single side molding step is performed to apply molding 136 over the first assembly 110, the flip chip IC device 124, the wire bonds 134, and the surface 130 of the substrate 128. Solder ball interconnects 138 are attached to electrical connection points on a surface 132 of the substrate 128. Each solder ball interconnect 138 provides an electrical connection point of the SiP structure 108 to be mounted to another electronic device, such as a circuit board.

FIG. 6 illustrates a cut out side view of another conventional SiP structure. The SiP structure 140 shown in FIG. 6 uses another interposer with wire bonding structure. The interposer with wire bonding structure includes a double side mounted interposer 148 mounted to a substrate 158 with the interposer 148 and the substrate 158 electrically interconnected to each other using wire bonds 164. An assembly 142 is first formed by interconnecting a flip chip IC device 144 to a surface 150 of the substrate 148 using solder ball interconnects 146, and interconnecting a flip chip IC device 154 to a surface 152 of the substrate 148 using solder ball interconnects 156. The substrate 148 functions as an interposer. The assembly 142 is then mounted to the substrate 158 by attaching a surface 170 of the flip chip IC device 154 to a surface 160 of the substrate 158, such as by using an adhesive (not shown). Peripheral electrical connection points on the surface 150 of the substrate 148 are then electrically connected to select peripheral electrical connection points on the surface 160 of the substrate 158 by one or more wire bonds 164. A footprint of the substrate 148 is smaller than that of the substrate 158 to enable this wire bonding connection between the two substrates. A single side molding step is performed to apply molding 166 over the assembly 142, the wire bonds 164, and the surface 160 of the substrate 158. Solder ball interconnects 168 are attached to electrical connection points on a surface 162 of the substrate 158. Each solder ball interconnect 168 provides an electrical connection point of the SiP structure 140 to be mounted to another electronic device, such as a circuit board.

A problem with the stacking with wire bonding structures, such as those shown in FIGS. 4-6, is that the wire loop height is limited. As such, these structures cannot be used when the top side wire bonding location, such as the top surface of either substrate 86, 116, 148, is high due to underlying IC device thickness.

SUMMARY OF THE INVENTION

It is an objective of the present disclosure to provide an improved SiP structure through the use of one or more interposers positioned to form a center cavity into which one or more electronic components can be mounted. The improved SiP structure provides a reduced footprint using the one or more interposers and formed center cavity without the need of laser drilling, exposed molding, and/or double side molding.

In an aspect, a system in package structure is disclosed. The system in package structure includes a first substrate, a first electronic component, a second substrate, a second electronic component, one or more interposers, and a single side molding layer. The first substrate comprises a first surface of the first substrate and a second surface of the first substrate opposing the first surface of the first substrate. The first electronic component is mechanically and electrically coupled to the first surface of the first substrate. The second substrate comprises a first surface of the second substrate and a second surface of the second substrate opposing the first surface of the second substrate. The one or more interposers are positioned between and mechanically and electrically coupled to the first substrate and the second substrate, wherein the one or more interposers form a central cavity between the one or more interposers, the second surface of the first substrate, and the first surface of the second substrate. The second electronic component is positioned within the center cavity, wherein the second electronic component is mechanically and electrically coupled to either the first substrate or the second substrate. The single side molding layer is applied to the first surface of the second substrate, wherein the single side molding layer encapsulates the first substrate, the first electronic component, the one or more interposers, and the second electronic component. In some embodiments, a footprint of the first substrate is smaller than a footprint of the second substrate. In some embodiments, the first substrate comprises a first circuit board and the second substrate comprises a second circuit board. In some embodiments, each of the one or more interposers comprises a first interposer surface and a second interposer surface opposing the first interposer surface, wherein the first interposer surface of each interposer is mechanically and electrically coupled to the second surface of the first substrate and the second interposer surface of each interposer is mechanically and electrically coupled to the first surface of the second substrate. In some embodiments, each interposer comprises a circuit board including one or more electrically conductive interconnects extending from the first interposer surface of each interposer to the second interposer surface of each interposer. In some embodiments, each interposer comprises a column of electrically conductive material. In some embodiments, the second electronic component is mechanically and electrically coupled to the second surface of the first substrate to form a double side mounted first substrate. In some embodiments, the first electronic component is a flip-chip IC device or a wire bonded IC device. In some embodiments, the second electronic component is a flip-chip IC device. In some embodiments, the system in package structure further comprises a plurality of electrically conductive interconnects coupled to the second surface of the second substrate, wherein the plurality of electrically conductive interconnects provide external connectivity from the system in package structure. In some embodiments, the system in package structure further comprises one or more additional second electronic components positioned within the center cavity, wherein each additional electronic component is mechanically and electrically coupled to either the first substrate or the second substrate.

In another aspect, another system in package structure is disclosed. The system in package structure includes a first package, a second package, and a plurality of electrically conductive interconnects. The first package comprises a first substrate having a first surface of the first substrate and a second surface of the first substrate opposing the first surface of the first substrate, a first electronic component mechanically and electrically coupled to the first surface of the first substrate, and a first single side molding layer coupled to the first surface of the first substrate and encapsulating the first electronic component. The second package comprises a second substrate, one or more interposers, a second electronic component, and a second single side molding layer. The second substrate comprises a first surface of the second substrate and a second surface of the second substrate opposing the first surface of the second substrate. Each interposer is mechanically and electrically coupled to the first surface of the second substrate, wherein the one or more interposers form a central cavity between the one or more interposers. The second electronic component is positioned within the center cavity and mechanically and electrically coupled to the first surface of the second substrate. The second single side molding layer is coupled to the first surface of the second substrate and encapsulates the first electronic component, the one or more interposers except for an exposed contact surface of each interposer. The plurality of electrically conductive interconnects mechanically and electrically couple the second surface of the first substrate to the exposed contact surface of each interposer. In some embodiments, the first substrate comprises a first circuit board and the second substrate comprises a second circuit board. In some embodiments, each of the one or more interposers comprises a first interposer surface and a second interposer surface opposing the first interposer surface, the first interposer surface of each interposer is the exposed contact surface of each interposer, wherein the second interposer surface of each interposer is mechanically and electrically coupled to the first surface of the second substrate. In some embodiments, each interposer comprises a circuit board including one or more electrically conductive interconnects extending from the first interposer surface of each interposer to the second interposer surface of each interposer. In some embodiments, each interposer comprises a column of electrically conductive material. In some embodiments, the first electronic component is a flip-chip IC device or a wire bonded IC device. In some embodiments, the second electronic component is a flip-chip IC device. In some embodiments, the system in package structure further comprises a plurality of second electrically conductive interconnects coupled to the second surface of the second substrate, wherein the plurality of second electrically conductive interconnects provide external connectivity from the system in package structure.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Figure 1:
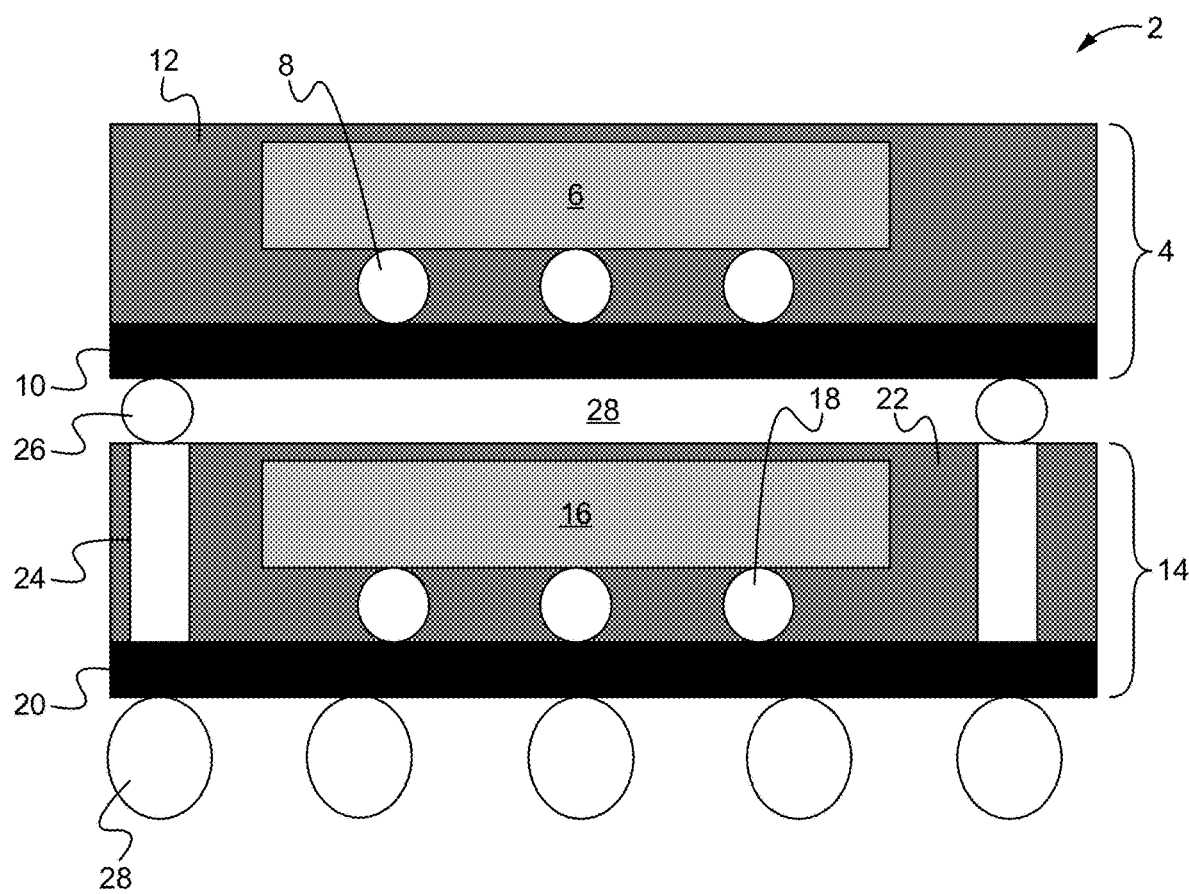
FIG. 1 illustrates a cut out side view of a conventional SiP structure.

Embodiments of the present application are directed to a system in package structure. Those of ordinary skill in the art will realize that the following detailed description of the system in package structure is illustrative only and is not intended to be in any way limiting. Other embodiments of the system in package structure will readily suggest themselves to such skilled persons having the benefit of this disclosure.

Reference will now be made in detail to implementations of the system in package structure as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments are directed to a SiP structure that includes a first substrate, a second substrate, and a plurality of interposers interconnected to provide first level interconnectivity between multiple IC devices within the SiP structure and second level interconnectivity external to the SiP structure. The second substrate and the interposers are assembled as a sub-assembly structure that has a center cavity formed between the interposers, the second substrate forming a bottom surface of the center cavity. One or more electronic components can be positioned within the center cavity. In some embodiments, the first substrate is a double side mounted substrate with one or more IC devices, or other electronic components, mounted on a first side positioned within the center cavity when the first substrate is mounted to the interposers. In other embodiments, one or more IC devices, or other electronic components, are mounted to the second substrate within the center cavity, and the first substrate is a single side mounted substrate mounted to the interposers. The resulting structure is single side molded on one side of the second substrate to encapsulate the interposers, the first substrate, any electronic components positioned within the center cavity, and any electronic components mounted to the first substrate. In some embodiments, a conformal coating is applied over the molded structure for EMI protection. By adding the second substrate and forming the center cavity structure, the SiP structure eliminates the needs for double side molding, exposed molding, laser drill, or grinding after molding.

As used herein, reference to a substrate can refer to a single layer or multi-layer circuit board, or any other type of substrate having one or more electrically non-conductive layers and one or more electrically conductive layers, each of the electrically conductive layers can be patterned to form conductive interconnects, such as conductive traces, contact pads, via annular rings, or the like. The substrate can also include any number of electrically conductive vias or through-vias for interconnecting various conductive layers of the substrate.

As also used herein, reference to an interposer can refer to a structure that provides electrical conduction paths from one side of the structure to another, which can be used to provide interconnectivity between electrical connection points on one component to electrical connection points on another component. Examples of interposers include, but are not limited to, a single layer or multi-layer circuit, a copper column or other shaped copper structure, or any other type of substrate capable of providing the defined electrical interconnectivity between electrical connection points.

As also used herein, reference is made to IC devices. It is understood that an IC device can be any type of conventional assembly of electronic components, fabricated as a single unit, which includes miniaturized active devices, for example transistors and diodes, and passive devices, for example capacitors and resistors, and their interconnections. Reference to an IC device is understood to include electronic components with similar common terms and functionality including, but not limited to, a microelectronic circuit, microchip, chip, or die. In general, the SiP structures described herein can be construed to reference electronic components in those instances where an IC device is specified. An electronic component can be any conventional active or passive electronic component, or combination of multiple electronic components, including, but not limited to, IC devices, capacitors, resistors, power supplies, or the like.

Figure 7:
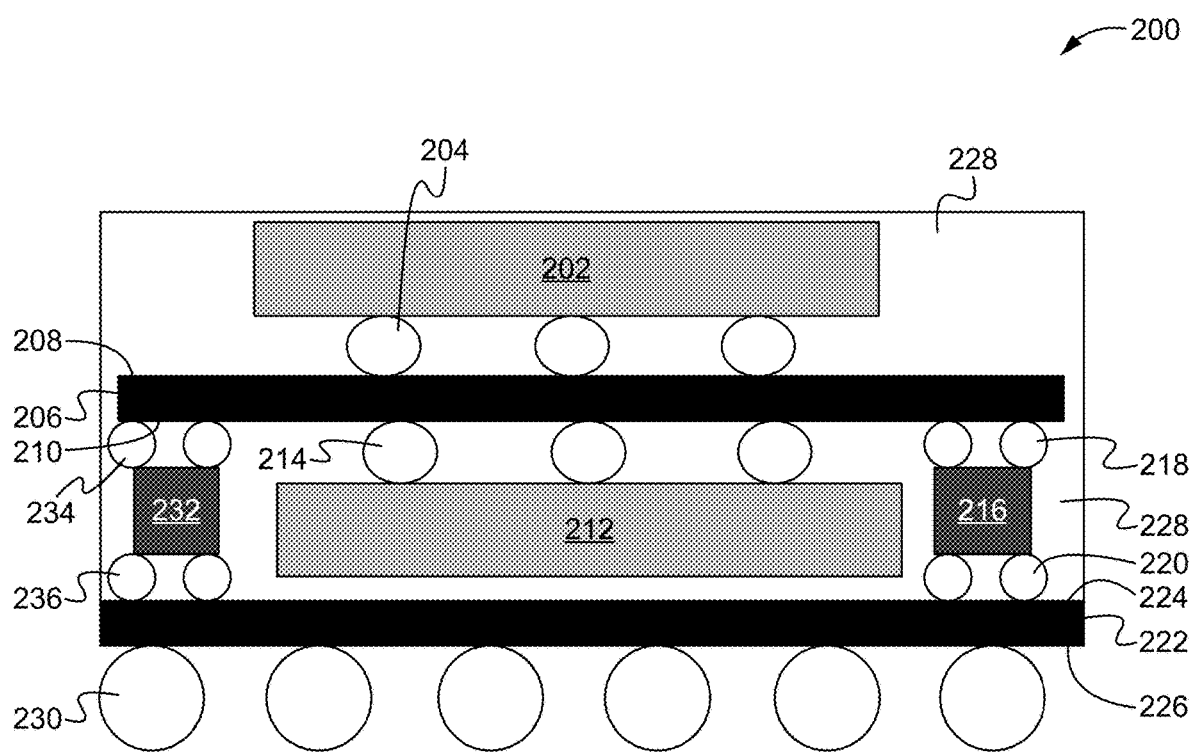
FIG. 7 illustrates a cut out side view of a SiP structure according to some embodiments.

FIG. 7 illustrates a cut out side view of a SiP structure according to some embodiments. The SiP structure 200 includes a double side mounted substrate 206 with a first flip-chip IC device 202 interconnected to a surface 208 of the first substrate 206 using interconnects 204 and a second flip-chip IC device 212 interconnected to a surface 210 of the first substrate 206 using interconnects 214. It is understood that the flip-chip IC devices can be IC devices other than flip-chip. It is also understood that the IC device 202 can be wire bonded to the surface 208 of the substrate 206. In some embodiments, the interconnects 204, 214 are solder ball interconnects. It is understood that alternative conventional interconnects can be used for mechanically and electrically interconnecting select electrical connection points on each IC device 202, 212 to select electrical connection points on the surfaces 208, 210. Although only a single IC device is shown mounted to the surface 208, it is understood that multiple IC devices can be mounted to the surface 208. An interposer 216 is interconnected to the surface 210 of the first substrate 206 using interconnects 218 and an interposer 232 is interconnected to the surface 210 of the first substrate 206 using interconnects 234. The interposer 216 is interconnected to a first surface 224 of the second substrate 222 using interconnects 220 and the interposer 232 is interconnected to the first surface 224 of the second substrate 222 using interconnects 236. Interconnects 230 are attached to electrical connection points on a surface 226 of the second substrate 222. Each interconnect 230 provides an electrical connection point of the SiP structure 200 to be mounted to another electronic device, such as a circuit board. In some embodiments, the interconnects 218, 220, 234, 236, 230 are solder ball interconnects. It is understood that alternative types of conventional interconnects can be used for mechanically and electrically interconnecting select electrical connection points on each interposer 216, 232 to select electrical connection points on the surfaces 210, 224 and for providing second level interconnections to select electrical connection points on the surface 226.

After the flip-chip IC devices 202, 212 are mounted to the first substrate 206 to form a double side mounted first substrate, the resulting double side mounted first substrate is mounted to the interposers 216, 232. A molding 228 encapsulates the interposers 216, 232, the IC devices 202, 212, and the substrate 206, as well as filling up the center cavity. A footprint of the first substrate 206 is smaller than a footprint of the second substrate 222 to enable molding material to reach underneath the first substrate 206 and fill the center cavity. As such, a single side molding step can be performed to apply the molding 228 to both sides of the double side mounted first substrate, including covering the flip-chip IC device 202 and first substrate 206, and filling the center cavity to encapsulate the flip-chip IC device 212 and the interposers 216, 232. In this case, single side molding refers to applying molding on a single side of the second substrate 222. In contrast, conventional double side molding requires two separate molding steps to be performed, one molding step to encapsulate electronic components mounted to a first side of a substrate and a second molding step to encapsulate electronic components mounted to a second side of the substrate. The SiP structure 200 eliminates the need for performing two separate molding steps related to double side molding and only performs a single molding step.

The second substrate 222 is a single section singulated from a larger, continuous panel (also referred to as a strip), whereas the first substrate 206 is singulated first, followed by assembly steps that form the double side mounted first substrate that includes the first substrate 206 and the mounted flip chip IC devices 202, 212. After the double side mounted first substrate is mounted to the interposers 216, 232 and the molding step is performed, the panel containing the second substrate 222 is singulated to form the discrete SiP structure 200. Performing these process steps while the second substrate 222 is still part of the larger panel enables single side molding over the surface 224 of the second substrate 222. Attachment of the solder ball interconnects 230 can be performed at any point in the process, including before or after the singulation step.

Figure 2:
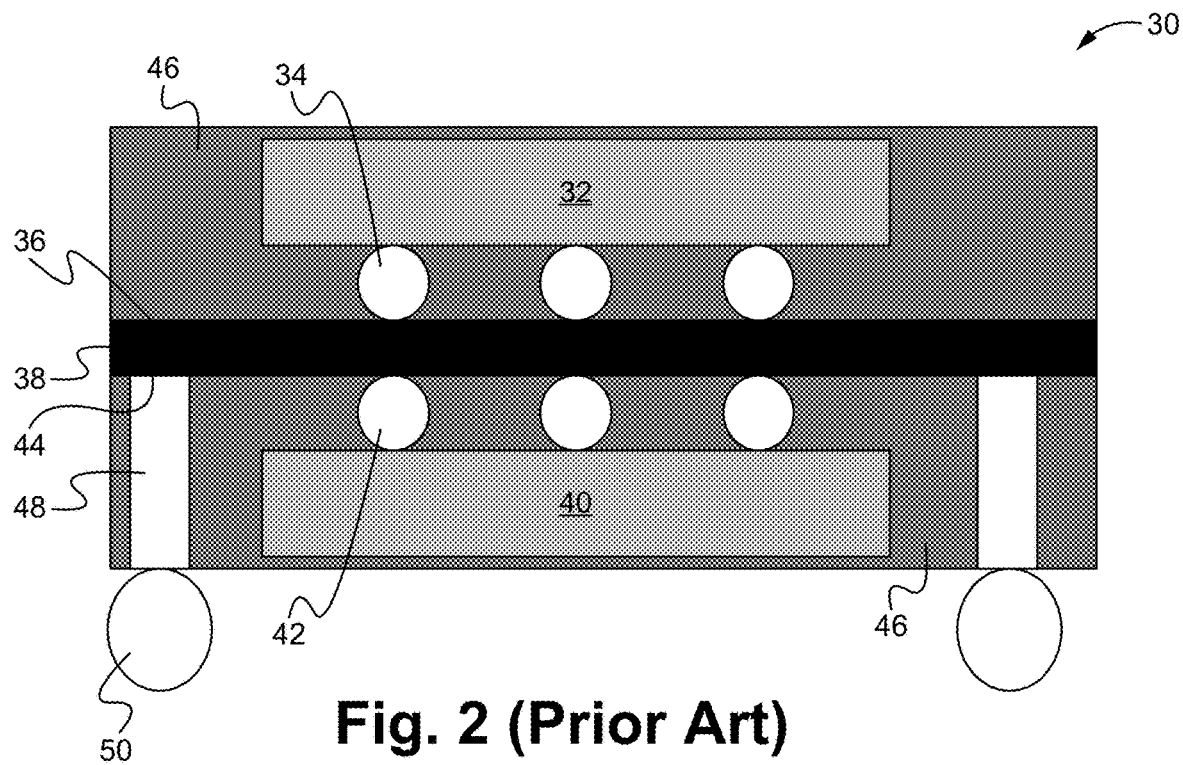
FIG. 2 illustrates a cut out side view of another conventional SiP structure.
Figure 3:
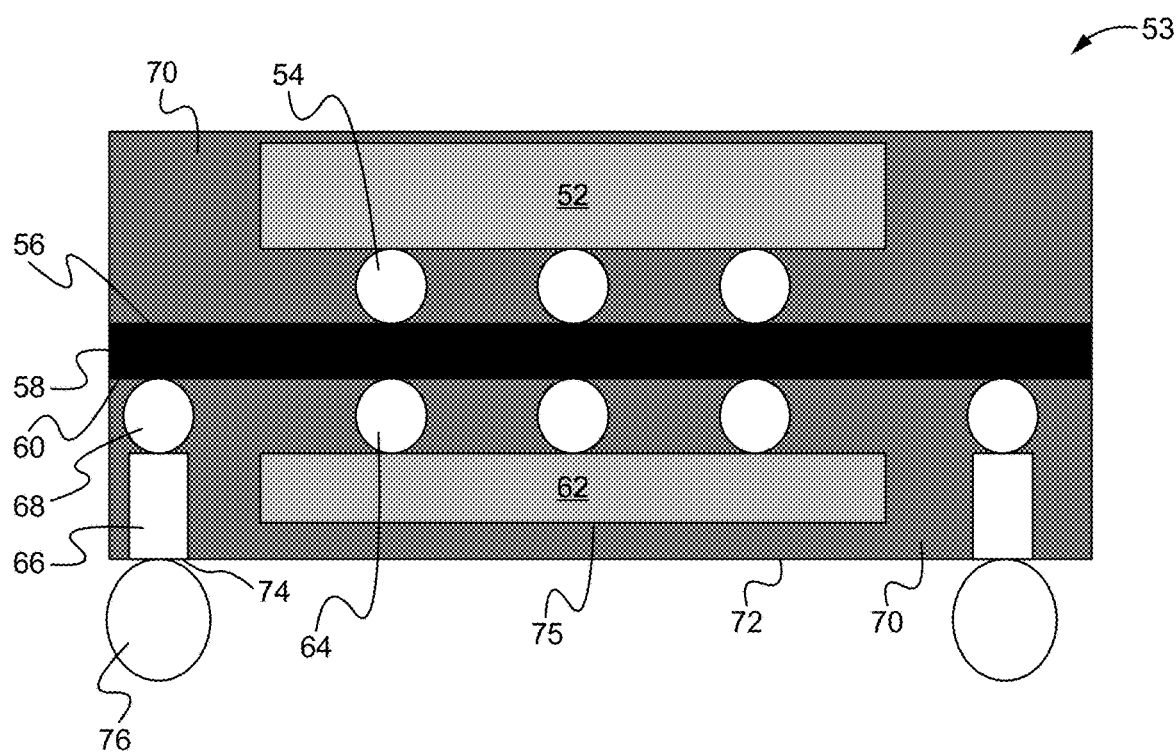
FIG. 3 illustrates a cut out side view of another conventional SiP structure.
Figure 4:
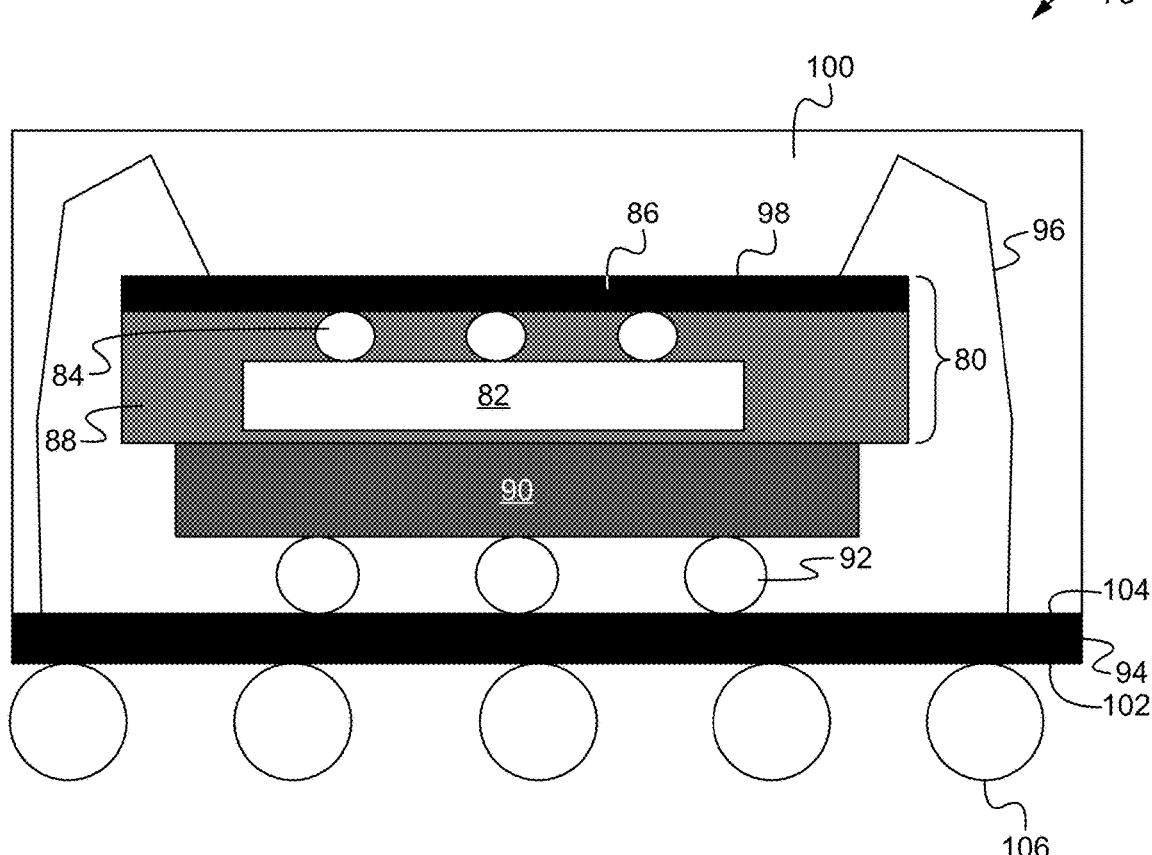
FIG. 4 illustrates a cut out side view of another conventional SiP structure.
Figure 5:
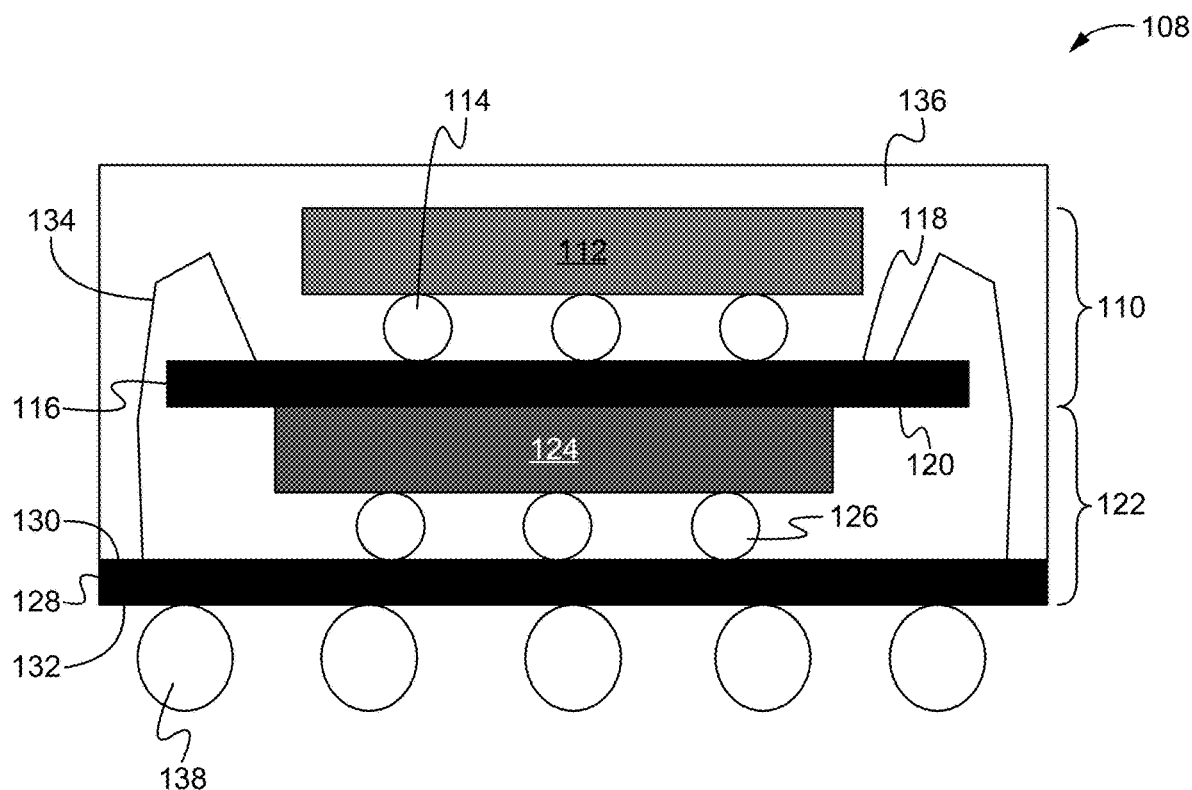
FIG. 5 illustrates a cut out side view of another conventional SiP structure.
Figure 6:
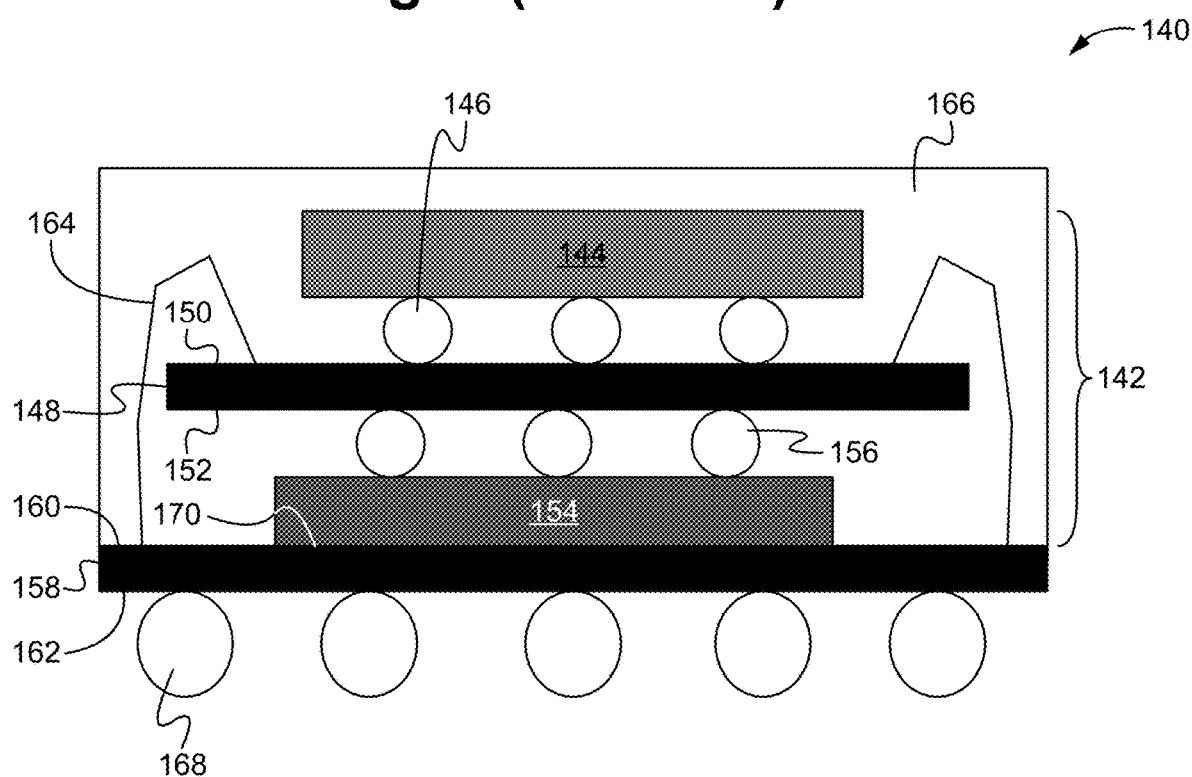
FIG. 6 illustrates a cut out side view of another conventional SiP structure.

By adding a second substrate and forming a cavity structure, the resulting SiP structure can be made without the needs for double side molding of the second substrate that provides second level interconnectivity external to the SiP structure (as in conventional SiP structure 30 of FIG. 2), exposed molding (as in conventional SiP structures 2, 30, 53 of FIGS. 1-3), laser drilling to form TMVs, or grinding after molding as a means of exposing interposer or copper column. Exposed molding techniques requires the use of a film applied over the component surface that is to be exposed. For example, in conventional SiP structure 53, in order to expose surface 74 of the interposer 66, a protective film must be applied over the surface 74, leaving the surface 74 exposed. In the SiP structure 200, the first substrate 206 and the second substrate 222 are each connected to the interposers 216, 232 prior to molding, and as such it is not necessary to perform an exposed molding technique to expose a contact surface for interconnecting the interposers. Also, connecting the interposers 216, 232 to the second substrate 222 enables smaller pitches for the interconnects to each interposer, for example the pitch between interconnects 220. If instead, the interposers were to be used as second level interconnections, such as in the conventional SiP structure 53 in FIG. 3, the interconnects would have larger pitches for the interconnects to the second level connected device, for example the pitch of the interconnects 76 in FIG. 3. Another advantage of the SiP structure 200 is that the double side mounted first substrate, including the substrate 206 and the flip-chip IC devices 202, 212, can be tested before mounting to the interposers 216, 232.

It is understood that the view shown in FIG. 7 is a cut out side view and therefore represents a two-dimensional view. It is contemplated that although the SiP structure shown in FIG. 7 shows two interposers more than two interposers can be used to form a central cavity. For example, any number of interposers, with the same or different dimensions, can be used to form a perimeter, ring, or other configuration that forms a boundary within which the central cavity is formed. It is also contemplated that a single interposer can be used that has a center cavity. As used herein, the term cavity generally applies to a three-dimensional volume horizontally bounded by the one or more interposers. As a completed SiP structure, the central cavity is vertically bounded by the first substrate and the second substrate.

Figure 8:
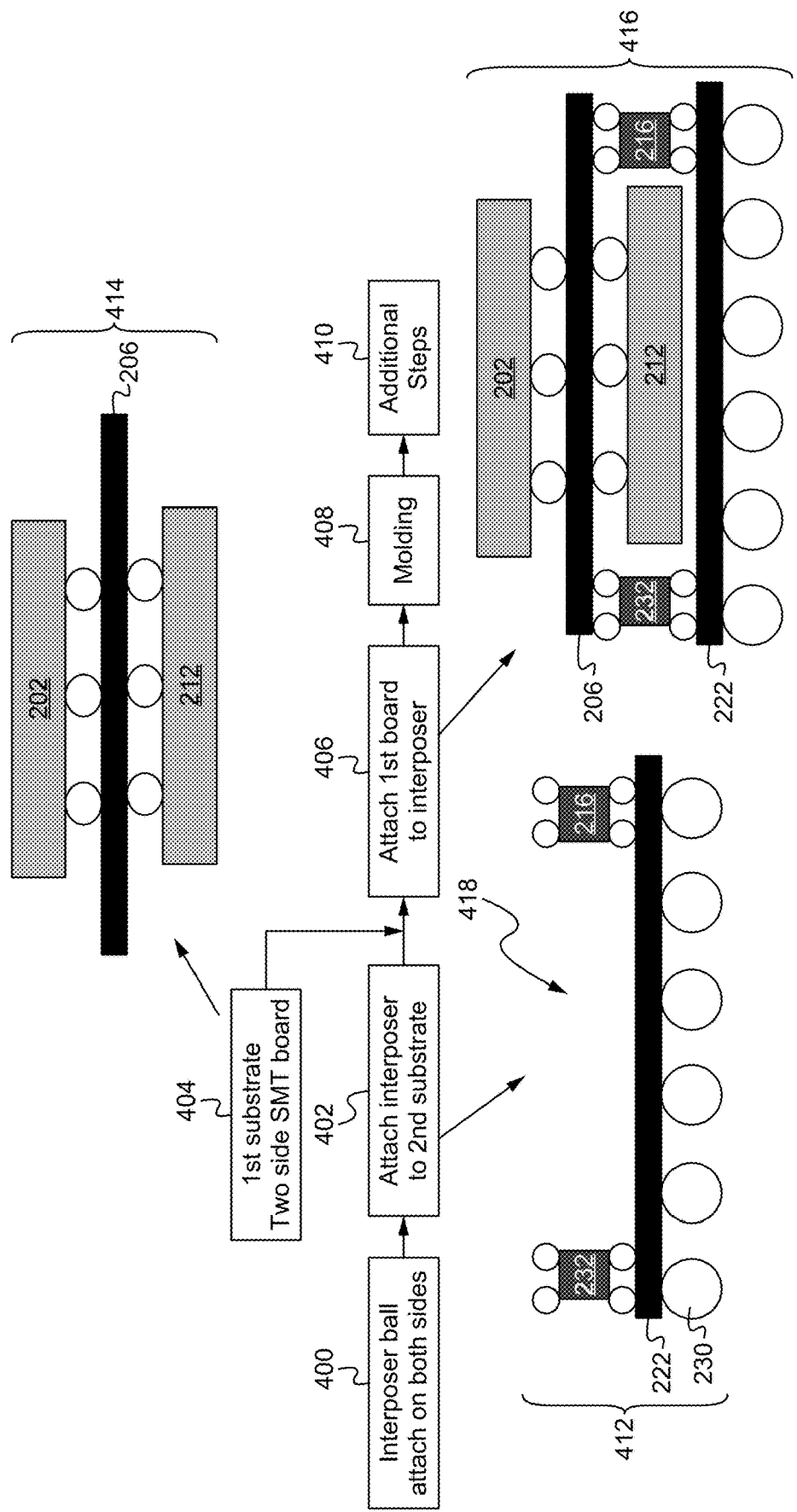
FIG. 8 illustrates various steps in the process used to manufacture a SiP structure according to some embodiments.

There are various process methodologies that can be used to make an SiP structure. FIG. 8 illustrates various steps in the process used to manufacture a SiP structure according to some embodiments. The SiP structure manufactured using the various steps shown in FIG. 8 is applied to the SiP structure 200 of FIG. 7. It is understood that the process can be used to manufacture alternative SiP structures. The exemplary structures shown for particular process steps are cut out side views of the SiP structure, or sub-assemblies of the SiP structure, according to the various process steps. At the step 400, interconnects are attached to both sides of each interposer. In some embodiments, each interconnect is a solder ball interconnect. Each solder ball interconnect is attached to a corresponding one electrical connection point, such as a contact pad or via annular ring, on a surface of the interposer. At the step 402, the interposers with attached interconnects are mounted to a second substrate. For example, the interposer 216 is mounted to the second substrate 222 and the interposer 232 is mounted to the second substrate 232 to form sub-assembly 412. The interposers are spaced apart from each other to form a central cavity, such as central cavity 418 bounded by the interposers 216, 232 and the second substrate 222. Second level interconnects are attached to the underside of the second substrate, such as interconnects 230 attached to the second substrate 222. The second level interconnects can be attached to the second substrate before or after the interposers are attached to the second substrate. In some embodiments, the second level interconnects are attached to the second substrate during a process step that follows the step 402. Although shown as an individual substrate, the second substrate is still part of a larger panel.

At the step 404, a first electronic component is mounted to one side of the first substrate and the second IC device is mounted to another side of the first substrate, thereby forming a double side mounted first substrate. The first substrate can be singulated from a larger panel either before or after mounting of the first and second IC devices. For example, the flip-chip IC device 202 is mounted to the surface 208 of the first substrate and the flip-chip IC device 212 is mounted to the surface 210 of the first substrate 206, thereby forming the double side mounted first substrate 414. The first substrate 206 is a singulated substrate. At the step 406, the double side mounted first substrate is mounted to the interposers with the second electronic component positioned within the central cavity. For example, the double side mounted first substrate 414, and in particular the first substrate 206, is mounted to the interposers 216, 232, with the flip-chip IC device 212 positioned in the central cavity 418. The resulting structure forms sub-assembly 416. At the step 408, a single side molding step is performed. Molding is applied over one side of the second substrate to encapsulate the attached interposers and mounted double side mounted first substrate, and fill the central cavity. For example, the molding 228 (FIG. 7) is applied over the surface 224 of the second substrate 222 to encapsulate the interposers 216, 232, and the double side mounted first substrate 414, as well as fill the central cavity. At the step 410, one or more additional process steps can be performed including, but not limited to, singulating the second substrate from a larger panel and applying an EMI coating. The second level interconnects, for example interconnects 230, can be mounted at any of the process steps described above.

Figure 9:
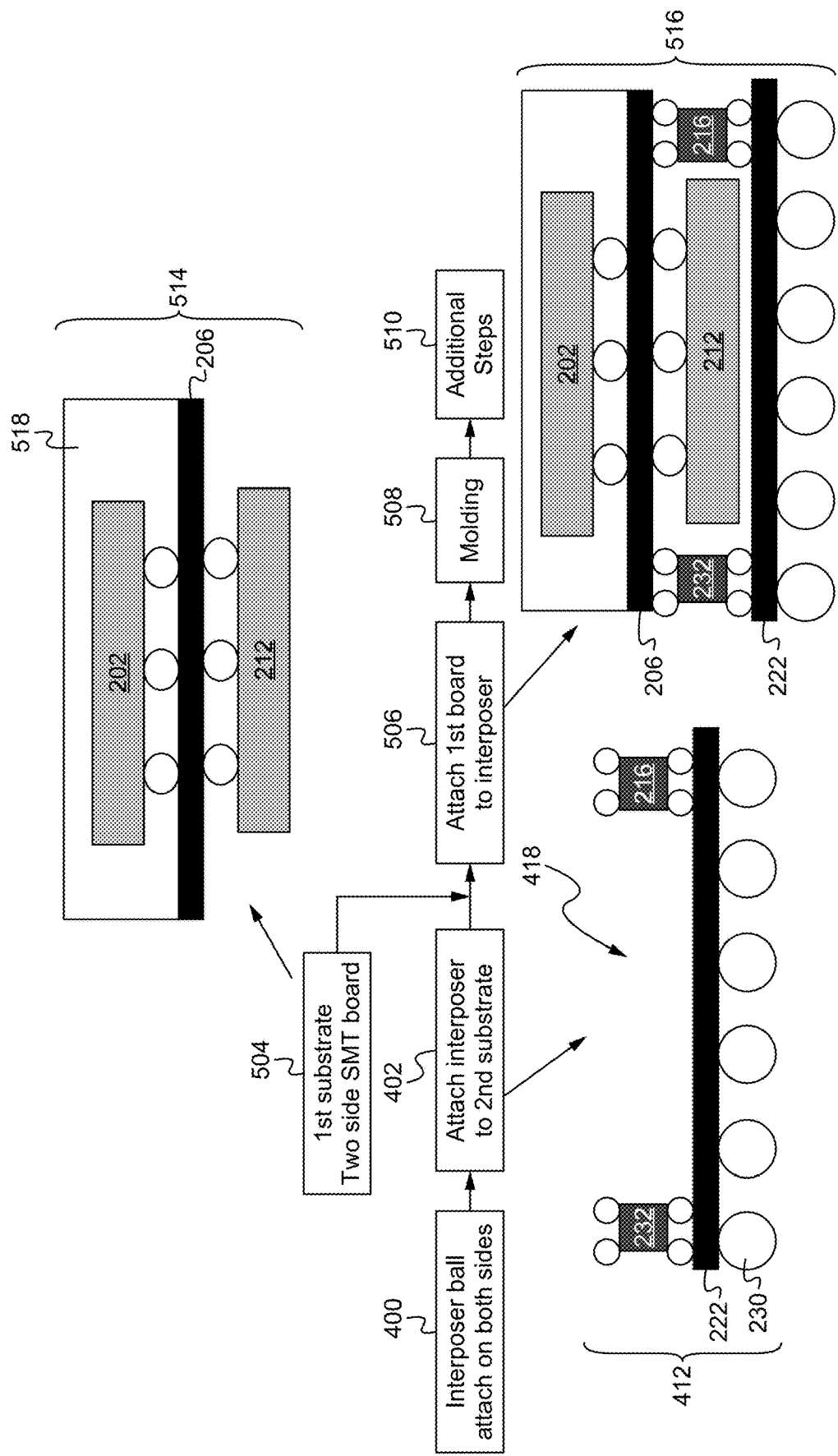
FIG. 9 illustrates various steps in the process used to manufacture a SiP structure according to some other embodiments.

It is understood that variations can be made to the process described above in regard to FIG. 8. One such variation is to perform a single side molding step of the first substrate prior to mounting to the interposers. FIG. 9 illustrates various steps in the process used to manufacture a SiP structure according to some other embodiments. The SiP structure manufactured using the various steps shown in FIG. 8 is applied to the SiP structure 200 of FIG. 7, with modification to the molding. It is understood that the process can be used to manufacture alternative SiP structures. The process shown in FIG. 9 includes the same steps 400 and 402 as the process shown in FIG. 8, which results in the sub-assembly 412 having interposers 216, 232 mounted to the second substrate 222.

At the step 504, a first electronic component is mounted to one side of the first substrate. For example, the flip-chip IC device 202 is mounted to the first substrate 206. At this step, the first substrate is part of a larger panel. A single side molding step is performed to apply molding over the one side of the first substrate, thereby encapsulating the mounted first electronic component. For example, molding 518 is applied over the surface 208 of the first substrate 206 to encapsulate the flip-chip IC device 202. The second electronic component is then mounted to the exposed other side of the first substrate. For example, the flip-chip IC device 212 is mounted to the exposed surface 210 of the first substrate 206. The first substrate is then singulated from the panel to form the double side mounted first substrate with single side molding 514. At the step 506, the double side mounted first substrate with a single side molding is mounted to the interposers with the second electronic component positioned within the central cavity. For example, the double side mounted first substrate with single side molding 514, and in particular the first substrate 206, is mounted to the interposers 216, 232, with the flip-chip IC device 212 positioned in the central cavity 418. The resulting structure forms sub-assembly 516. At the step 508, a single side molding step is performed. Molding is applied over one side of the second substrate to encapsulate the attached interposers and the mounted double side mounted first substrate with single side molding, and fill the central cavity. For example, the molding 228 (FIG. 7) is applied over the surface 224 of the second substrate 222 to encapsulate the interposers 216, 232, and the double side mounted first substrate with single side molding 514, as well as fill the central cavity. Since the top side volume is mostly occupied by molding compound applied at the step 504, for example the molding 518, during the final molding step at step 508 it is easier for molding material to flow into the central cavity between the first substrate and the second substrate. At the step 510, one or more additional process steps can be performed including, but not limited to, singulating the second substrate from a larger panel and applying an EMI coating. The second level interconnects, for example interconnects 230, can be mounted at any of the process steps described above. This embodiment may be beneficial, for example, in the case where wire bonding is used to interconnect the IC device 202 to the surface 208 of the first substrate 206. Single side molding of the IC device 202 with wire bonding protects the wire bonding interconnection for succeeding process steps.

Figure 10:
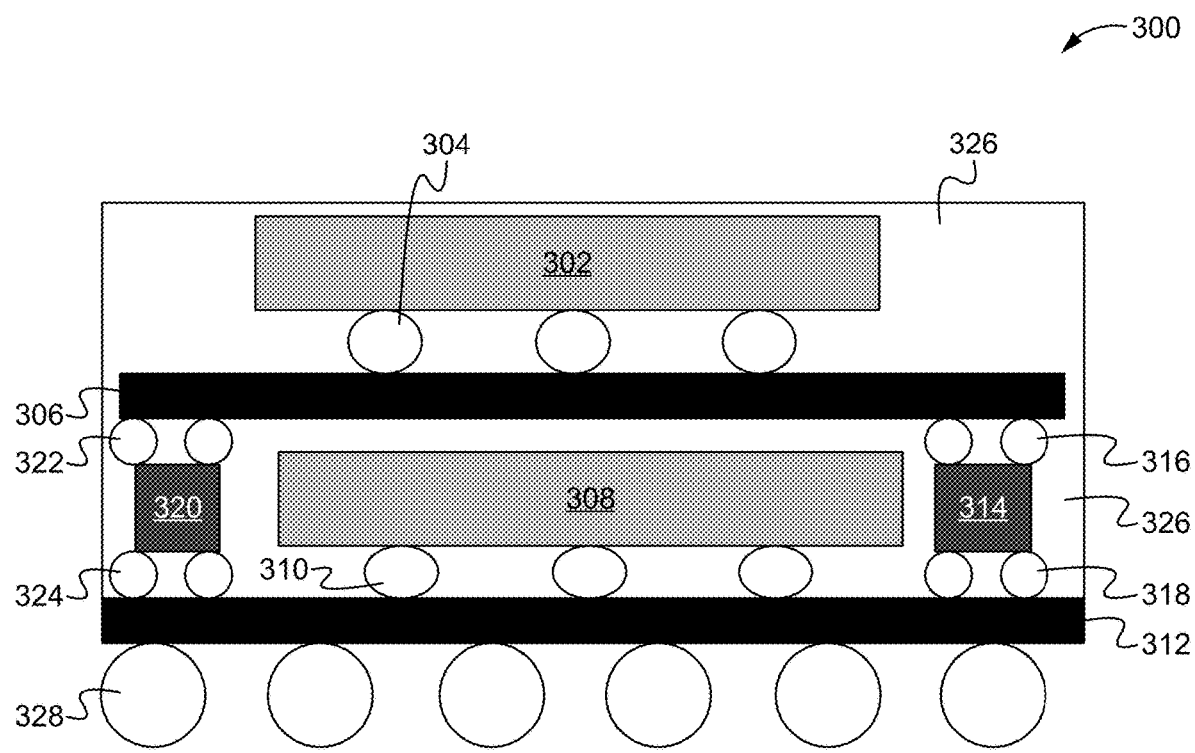
FIG. 10 illustrates a cut out side view of an alternative SiP structure according to some embodiments.

In the exemplary SiP structure shown in FIG. 7, the electronic component positioned with the center cavity is mounted to the first substrate. It is understood that the electronic component positioned within the center cavity can be instead be mounted to the second substrate. FIG. 10 illustrates a cut out side view of an alternative SiP structure according to some embodiments. The SiP structure 300 in FIG. 10 is similar to the SiP structure 200 in FIG. 7 except that the SiP structure 300 includes an electronic component positioned within the center cavity that is mounted to the second substrate. The SiP structure 300 includes a single side mounted first substrate 306 with a first flip-chip IC device 302 interconnected to the first substrate 306 using interconnects 304. An interposer 314 is interconnected to the first substrate 306 using interconnects 316 and an interposer 320 is interconnected to the first substrate 306 using interconnects 322. The interposer 314 is interconnected to the second substrate 312 using interconnects 318 and the interposer 320 is interconnected to the second substrate 312 using interconnects 324. A second flip-chip IC device 308 is positioned within a center cavity formed between interposers 314, 320 and is interconnected to the second substrate 312 using interconnects 310. Interconnects 328 are attached to electrical connection points on the second substrate 312. Each interconnect 328 provides an electrical connection point of the SiP structure 300 to be mounted to another electronic device, such as a circuit board. In some embodiments, the interconnects 316, 318, 322, 324, 328 are solder ball interconnects. It is understood that alternative types of conventional interconnects can be used for mechanically and electrically interconnecting select electrical connection points on each interposer 314, 320 to select electrical connection points on the first substrate 306 and the second substrate 312 and for providing second level interconnections to select electrical connection points on the second substrate 312. The SiP structure 300 can be made using similar process steps as that shown in FIG. 8 or 9. In some embodiments, the SiP structure 300 is made by single side mounting the flip-chip IC device 302 to the first substrate, separately single side mounting the flip-chip IC device 308 and interposers 314, 320 to the second substrate 312, mounting the single side mounted firsts substrate 306 to the interposers 314, 320, followed by single side molding. The SiP structure 300 is similar to a PoP structure, but uses a single molding step enabled by the interposers. If designed well, the first substrate and the second substrate can be tested separately before mounting and molding.

A comparison of the SiP structure 200 of FIG. 7 and the SiP structure 300 of FIG. 10 shows that the SiP structure 200 has a relatively shorter interconnection path between SiP internal electronic components, but connection paths from the electronic components to the second level interconnection are longer. Conversely, the SiP structure 300 has a relatively shorter interconnection path between the electronic component mounted to the second substrate and the second level interconnection, but connection paths between the SiP internal electronic components are longer.

Figure 11:
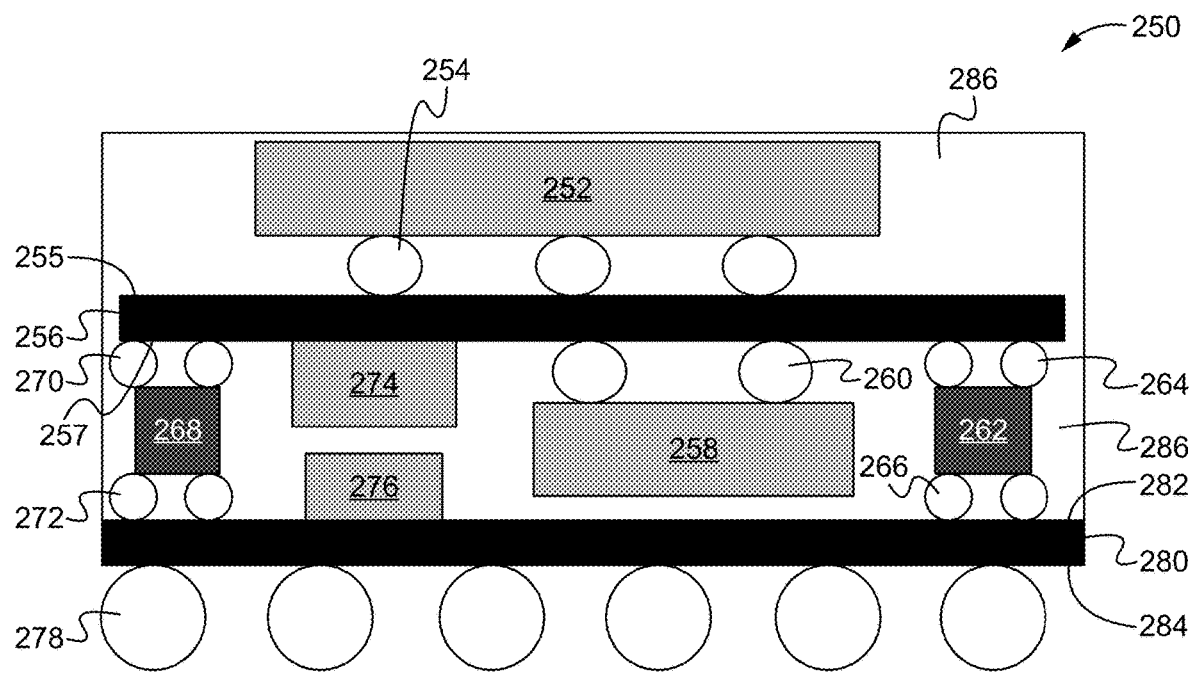
FIG. 11 illustrates a cut out side view of another alternative SiP structure according to some embodiments.

In the exemplary SiP structures shown in FIGS. 7 and 10, there is a single electronic component, for example flip-chip IC device 212 in FIG. 7, positioned within the center cavity formed between the interposers. Alternative structures are also contemplated where more than one electronic component can be positioned in the center cavity. The number and size of the electronic components positioned within the center cavity are selected such that there is no Z-height conflict between the first substrate and the second substrate. FIG. 11 illustrates a cut out side view of another alternative SiP structure according to some embodiments. The SiP structure 250 in FIG. 11 is similar to the SiP structure 200 in FIG. 7 except that the SiP structure 250 includes multiple electronic components positioned within the center cavity formed between the interposers. The SiP structure 250 includes a double side mounted first substrate 256 with a first flip-chip IC device 252 interconnected to a surface 255 of the first substrate 256 using interconnects 254 and a second flip-chip IC device 258 interconnected to a surface 257 of the first substrate 256 using interconnects 260. An interposer 262 is interconnected to the surface 257 of the first substrate 256 using interconnects 264 and an interposer 268 is interconnected to the surface 257 of the first substrate 256 using interconnects 270. The interposer 262 is interconnected to a surface 282 of the second substrate 280 using interconnects 266 and the interposer 268 is interconnected to the surface 282 of the second substrate 280 using interconnects 272. Interconnects 278 are attached to electrical connection points on a surface 284 of the second substrate 280. Each interconnect 278 provides an electrical connection point of the SiP structure 250 to be mounted to another electronic device, such as a circuit board. In some embodiments, the interconnects 264, 266, 270, 272, 278 are solder ball interconnects. It is understood that alternative types of conventional interconnects can be used for mechanically and electrically interconnecting select electrical connection points on each interposer 262, 268 to select electrical connection points on the surfaces 257, 282 and for providing second level interconnections to select electrical connection points on the surface 284.

Additional electronic components can be mounted to either the surface 257 of the first substrate 256 or the surface 282 of the second substrate 280. In the exemplary configuration shown in FIG. 11, a first additional electronic component 274 is mounted to the surface 257, and a second additional electronic component 276 is mounted to the surface 282. It is understood that alternative positions and alignments of the additional electronic components than that shown in FIG. 11 are also contemplated. It is also understood that each additional electronic component can be interconnected to either the first substrate or the second substrate via corresponding electrical connection points on each and an intervening interconnect.

Figure 12:
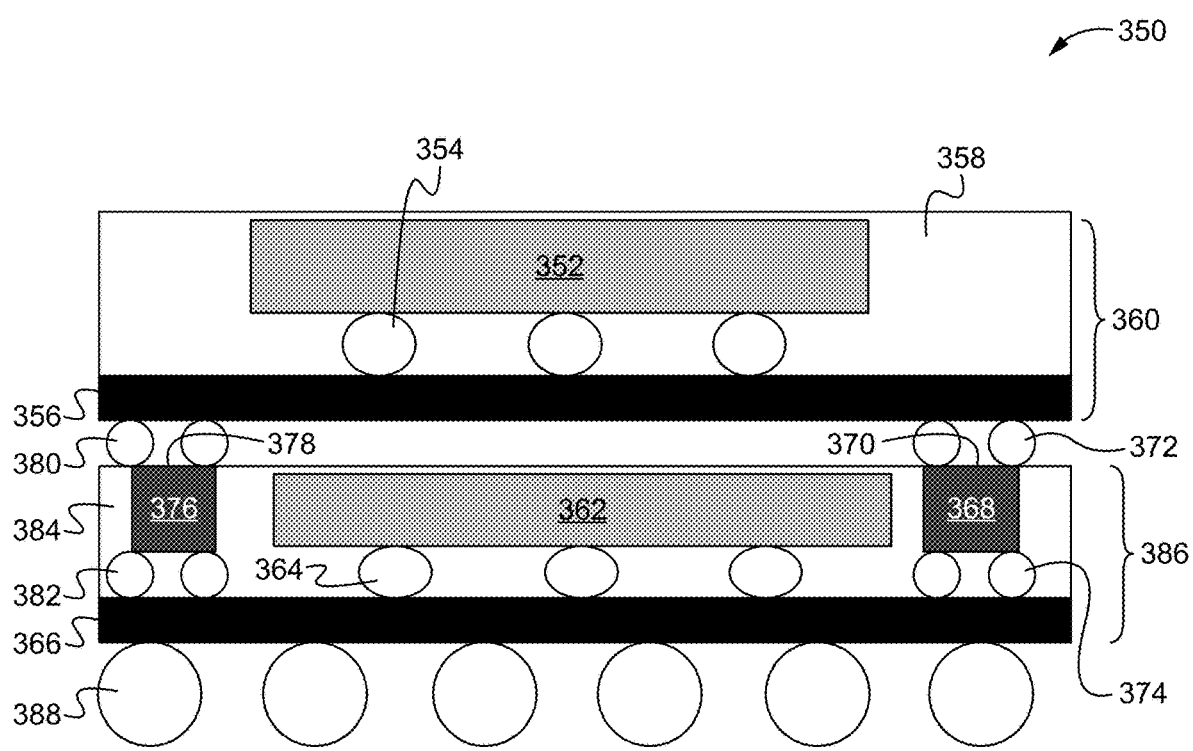
FIG. 12 illustrates a cut out side view of yet another alternative SiP structure according to some embodiments.

As previously described, the SiP structure 300 of FIG. 10 is similar to a PoP structure, but only a single molding step is performed. An SiP structure having a true PoP configuration can also be accomplished using interposers. In this embodiment, a first package is made having a single side mounted first substrate which is single side molded, and a second package is made having a second substrate and interposers structure that form a center cavity into which an IC device is positioned and mounted to the second substrate. The second package is single side molded including an exposed molding technique for exposing a contact surface of each interposer. The first package is interconnected to the second package using interconnects coupled to the first substrate and the exposed contact surface of each interposer. FIG. 12 illustrates a cut out side view of yet another alternative SiP structure according to some embodiments. The SiP structure 350 in FIG. 12 is similar to the SiP structure 300 in FIG. 10 except that the SiP structure 350 is made from two separate packages interconnected via interposers. Specifically, the SiP structure 350 includes a first package 360 and a second package 386. The first package includes a single side mounted first substrate 356 with a first flip-chip IC device 352 interconnected to the first substrate 356 using interconnects 354. The single side mounted first substrate 356 is single side molded with molding 358 that encapsulates the flip-chip IC device 352. The second package includes a single side mounted second substrate 366 with a second flip-chip IC device 362 interconnected to the second substrate 366 using interconnects 364. An interposer 368 is interconnected to the second substrate 366 using interconnects 374 and an interposer 376 is interconnected to the second substrate 366 using interconnects 382. The single side mounted first substrate 366 is single side molded with molding 384 with an exposed molding technique that encapsulates the flip-chip IC device 362 and interposers 368, 384 while leaving exposed a surface 370 of the interposer 368 and a surface 378 of the interposer 376. The first package 360 is interconnected to the first package 386 by interconnects. Specifically, interconnects 372 are attached to electrical connection points on the exposed surface 370 of the interposer 368, and interconnects 380 are attached to electrical connection points on the exposed surface 378 of the interposer 376. The interposer 368 is interconnected to the first substrate 356 using interconnects 372 and the interposer 376 is interconnected to the first substrate 356 using interconnects 380. Interconnects 388 are attached to electrical connection points on the second substrate 366. Each interconnect 388 provides an electrical connection point of the SiP structure 350 to be mounted to another electronic device, such as a circuit board. In some embodiments, the interconnects 372, 374, 380, 382, 388 are solder ball interconnects. It is understood that alternative types of conventional interconnects can be used for mechanically and electrically interconnecting select electrical connection points on each interposer 368, 376 to select electrical connection points on the substrates 356, 366 and for providing second level interconnections to select electrical connection points on the second substrate 366.

The present application has been described in terms of specific embodiments incorporating details to facilitate the understanding of the principles of construction and operation of the system in package structure. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A system in package structure comprising:
   a. a first substrate comprising a first surface of the first substrate and a second surface of the first substrate opposing the first surface of the first substrate;
   b. a first electronic component mechanically and electrically coupled to the first surface of the first substrate;
   c. a second substrate comprising a first surface of the second substrate and a second surface of the second substrate opposing the first surface of the second substrate;
   d. one or more interposers positioned between and mechanically and electrically coupled to the first substrate and the second substrate, wherein the one or more interposers form a central cavity between the one or more interposers, the second surface of the first substrate, and the first surface of the second substrate;
   e. a second electronic component positioned within the center cavity, wherein the second electronic component is mechanically and electrically coupled to either the first substrate or the second substrate; and
   f. a single side molding layer applied to the first surface of the second substrate, wherein the single side molding layer encapsulates the first substrate, the first electronic component, the one or more interposers, and the second electronic component.

2. The system in package structure of claim 1 wherein a footprint of the first substrate is smaller than a footprint of the second substrate.

3. The system in package structure of claim 1 wherein the first substrate comprises a first circuit board and the second substrate comprises a second circuit board.

4. The system in package structure of claim 1 wherein each of the one or more interposers comprises a first interposer surface and a second interposer surface opposing the first interposer surface, wherein the first interposer surface of each interposer is mechanically and electrically coupled to the second surface of the first substrate and the second interposer surface of each interposer is mechanically and electrically coupled to the first surface of the second substrate.

5. The system in package structure of claim 4 wherein each interposer comprises a circuit board including one or more electrically conductive interconnects extending from the first interposer surface of each interposer to the second interposer surface of each interposer.

6. The system in package structure of claim 4 wherein each interposer comprises a column of electrically conductive material.

7. The system in package structure of claim 1 wherein the second electronic component is mechanically and electrically coupled to the second surface of the first substrate to form a double side mounted first substrate.

8. The system in package structure of claim 1 wherein the first electronic component is a flip-chip IC device or a wire bonded IC device.

9. The system in package structure of claim 1 wherein the second electronic component is a flip-chip IC device.

10. The system in package structure of claim 1 further comprising a plurality of electrically conductive interconnects coupled to the second surface of the second substrate, wherein the plurality of electrically conductive interconnects provide external connectivity from the system in package structure.

11. The system in package structure of claim 1 further comprising one or more additional electronic components positioned within the center cavity, wherein each additional electronic component is mechanically and electrically coupled to either the first substrate or the second substrate.

* * * * *